United States Patent
Hokazono (10) Patent No.: US 8,610,201 B1
(45) Date of Patent: Dec. 17, 2013

(54) FINFET COMPRISING A PUNCH-THROUGH STOPPER

(75) Inventor: Akira Hokazono, Clifton Park, NY (US)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/587,327

(22) Filed: Aug. 16, 2012

(51) Int. Cl.
*H01L 29/76* (2006.01)

(52) U.S. Cl.
USPC ............ 257/328; 257/369; 257/E29.267; 438/283

(58) Field of Classification Search
USPC ............ 257/328, 369, 376, E21.41, E29.267; 438/283, 289
See application file for complete search history.

(56) References Cited

U.S. PATENT DOCUMENTS

| | | | |
|---|---|---|---|
| 7,863,163 B2 * | 1/2011 | Bauer | 438/481 |
| 8,035,199 B2 * | 10/2011 | Izumida et al. | 257/623 |
| 8,394,710 B2 * | 3/2013 | Cheng et al. | 438/558 |
| 2009/0267155 A1 | 10/2009 | Izumida et al. | |
| 2013/0065371 A1 * | 3/2013 | Wei et al. | 438/294 |
| 2013/0200455 A1 * | 8/2013 | Lo et al. | 257/347 |

* cited by examiner

*Primary Examiner* — Tuan N. Quach
(74) *Attorney, Agent, or Firm* — White & Case LLP (57) ABSTRACT

Structures and methods are presented relating to formation of finFET semiconducting devices. An approach is presented to facilitate formation of a pMOS finFET which can be combined with a nMOS finFET to form a balanced CMOS device. A Si:C layer can be utilized to suppress diffusion of group III and group V impurities, where suppression can utilize interstitial and substitutional phases. A Si:Ge layer can be utilized to facilitate determination of transition between a Si layer and a Si:C layer to enable a finFET to be formed having a required volume of fin material exposed for anticipated operation (e.g., a target Vth) of the finFET device.

15 Claims, 9 Drawing Sheets

FINFET COMPRISING A PUNCH-THROUGH STOPPER

FIELD

Embodiments described herein relate generally to structures and methods for prevention of dopant diffusion in a Fin-FET semiconductor device.

BACKGROUND

Fin field effect transistors (finFET) comprise a narrow source-channel-drain region (the fin) about which is formed a gate. Activation of the gate, source and drain facilitates current drivability in the channel between the source and the drain thereby facilitating operation of the finFET. An issue with finFET devices concerns controlling, from structures adjacent to the channel, diffusion of dopants and/or impurities, into the channel which accordingly affect electron/hole mobility in the channel and hence may deleteriously affect anticipated operation of the channel. For example, a high concentration of dopants/impurities in the channel can cause the channel threshold voltage (Vth) to drift away (i.e., increase or decrease) from an anticipated target Vth for the channel; and, also increase Vth variability.

Figure 15:
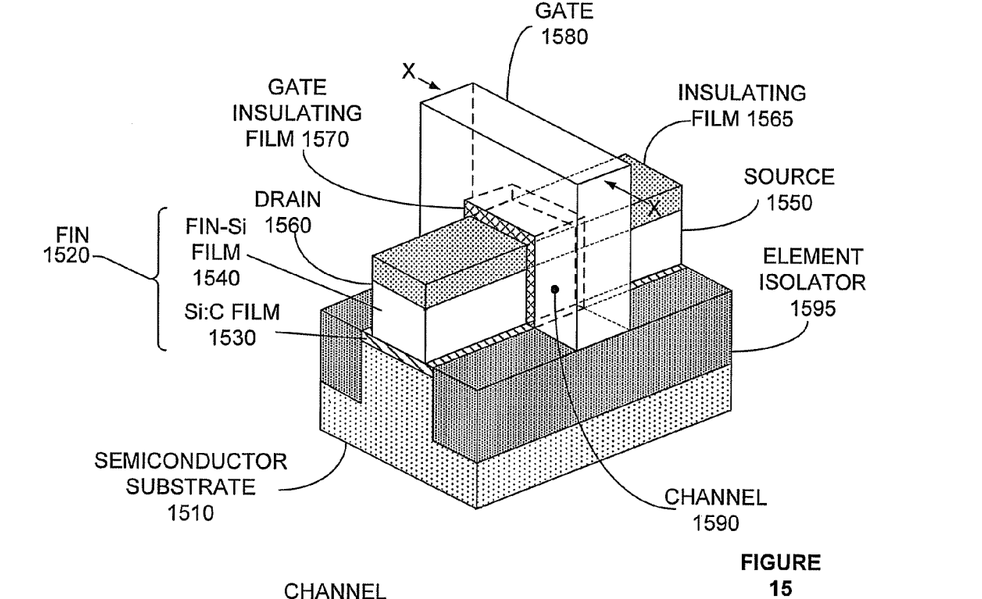
FIG. 15 illustrates a structure comprising a finFET.
Figure 16:
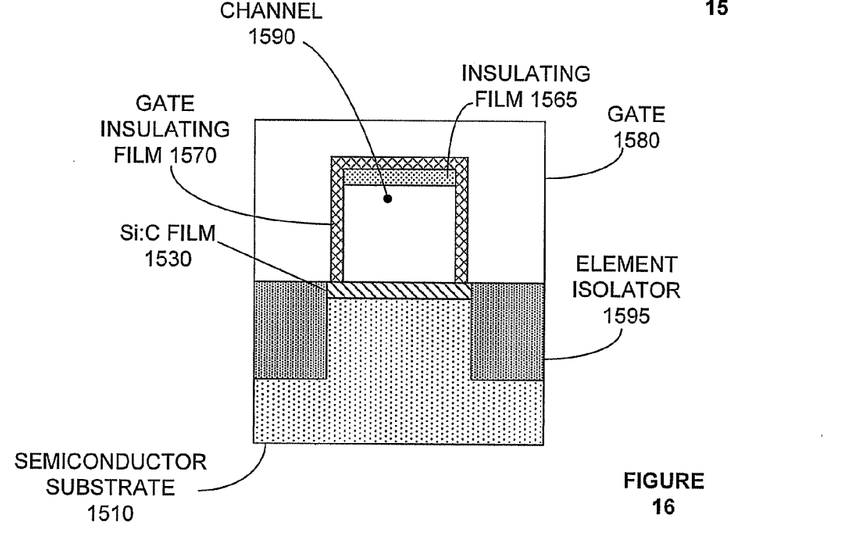
FIG. 16 illustrates a structure comprising a finFET sectioned about X-X.

With reference to FIGS. 15 and 16, presented are rudimentary depictions of a nMOS finFET device comprising a semiconductor substrate on which is formed a fin, around which is further formed a gate, where FIG. 16 is a section along plane X-X of FIG. 15, through the channel portion 1590. As shown in FIG. 15, a semiconductor substrate (e.g., a Si-containing structure) 1510 has formed thereon a fin 1520 comprising a carbon doped silicon (Si:C) film 1530 and a fin-Si film 1540, where the fin-Si 1540 has been further processed to form source 1550 and drain 1560, with an insulating film 1565 (e.g., tetraethyl orthosilicate (TEOS)) further formed thereon. A gate insulating film 1570 is formed over a portion of the fin-Si 1540 and the insulating film 1565, with a gate 1580 further formed thereon, where the portion of the fin-Si 1540 and insulating film 1565 acts as channel 1590. Element isolating layer 1595 can be deposited as part of formation of fin 1520, where in an aspect, element isolating layer 1595 can comprise of any suitable material, such as a high aspect ratio process (HARP) oxide layer. As part of the finFET device formation, a fin can be formed, a element isolating layer deposited thereon, with the element isolating layer planarized and etched to facilitate exposure of the fin. In effect, the size of a fin is a function of the dimensional accuracy of the subsequent processing.

Substrate 1510 can be doped with any suitable dopant, such as a p-type group III impurity, e.g., boron. To control electron/hole mobility in channel 1590, Si:C film 1530 acts as a diffusion suppressor, whereby diffusion of boron through the Si:C film 1530 is controlled, as described further herein.

Figure 17:
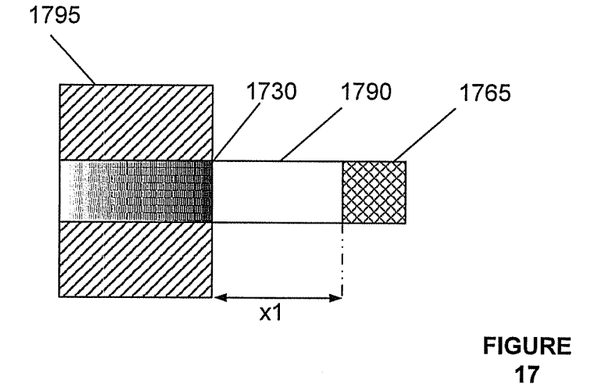
FIG. 17 illustrates a structure comprising a finFET.
Figure 18:
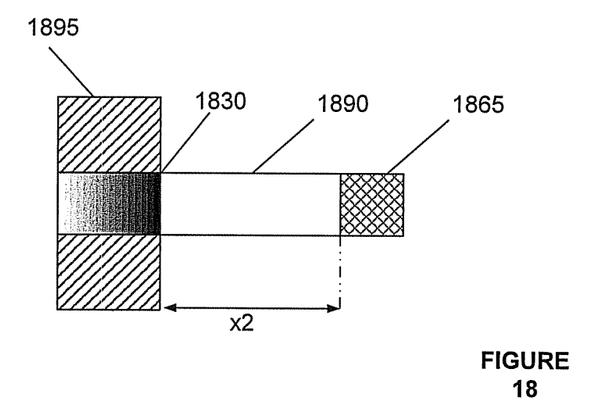
FIG. 18 illustrates a structure comprising a finFET.
Figure 19:
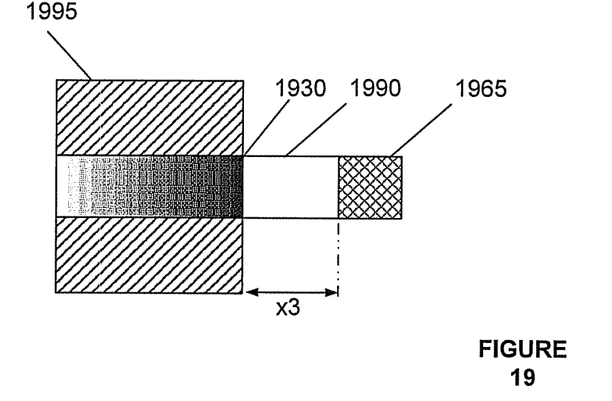
FIG. 19 illustrates a structure comprising a fin FET.

As shown in FIGS. 17-19, in a conventional structure the carbon concentration in the Si:C layer comprises approximately 1% carbon and hence the height (and volume) of the channel (e.g., channel 1790, 1890, 1990) is a direct function of the height of the element isolating layer (e.g., layer 1795, 1895, 1995). FIG. 17 illustrates a structure comprising insulating layer 1765, channel 1790, element isolating layer 1795, and Si:C concentration layer 1730, where the amount of fin 1790 exposed, dist x1, is of a required amount in accordance with device design, expected Vth, etc., i.e., the height of element isolating layer 1795 is correct, enabling the subsequently formed finFET to operate as expected, e.g., with an expected Vth, etc. FIG. 18 illustrates a structure comprising insulating layer 1865, channel 1890, element isolating layer 1895, and Si:C concentration layer 1830, where the amount of fin 1890 exposed, dist x2, is not as required with regard to device design, expected Vth, etc. FIG. 19 illustrates a structure comprising insulating layer 1965, channel 1990, element isolating layer 1995, and Si:C concentration layer 1930, where the amount of fin 1990 exposed, dist x3, is not as required with regard to device design, expected Vth, etc. A finFET formed from either of the fins illustrated in FIG. 18 or FIG. 19 will not operate as expected, e.g., with a Vth different to the anticipated Vth, etc. Hence, as illustrated, the fin height, x1, x2, x3, is a direct function of the height of a respective element isolating layer (e.g., layer 1795, 1895, 1995) which can introduce an undesirable degree of uncertainty regarding operation of a channel, e.g., operating Vth.

While approaches exist to form an nMOS finFET, formation of a pMOS finFET comprising a suitable punch-through stopper with expected Vth is still to be achieved for application with a complementary metal-oxide-semiconductor (CMOS) device. Further, accurate formation of a fin(s) with a desired height and respective placement of layers comprising a fin can be difficult with a conventional technique(s), and thus an approach to achieving a fin(s) comprising a required structure with high repeatability across a plurality of devices is also still to be achieved.

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the sole purpose of this summary is to present some concepts related to some exemplary non-limiting embodiments in a simplified form as a prelude to the more detailed description of the various embodiments that follow.

The subject innovation presents various techniques related to formation of finFET semiconducting devices. In an exemplary, non-limiting embodiment, structures and methods are presented to facilitate formation of a CMOS device, where a pMOS finFET which can be combined with a nMOS finFET to form a balanced CMOS device. A Si:C layer can be utilized to suppress diffusion of respective group III and group V impurities. Diffusion suppression can utilize interstitial and substitutional phases associated with the Si:C. In an exemplary, non-limiting embodiment, a pMOS finFET is presented comprising a Si substrate doped with arsenic which comprises a region of concentrated boron to facilitate control of the channel threshold voltage. By adding boron dopant the channel threshold voltage can be altered from a voltage that would be obtained by utilizing arsenic only.

In another exemplary, non-limiting embodiment, a Si:Ge layer can be utilized to facilitate determination of transition between a Si layer and a Si:C layer to enable a finFET to be formed having a required volume of fin material exposed for anticipated operation (e.g., a target Vth) of the finFET device. By incorporating a Si:Ge layer it is possible to identify where a Si layer transitions to a Si:C layer, and alternatively, where a Si:C layer transitions to a Si layer, enabling accurate removal of material to expose a defined channel region. By enabling a defined channel region to be exposed, variability in threshold voltage for the channel is minimized such that an expected area of channel is coupled to a subsequently formed gate, thereby enabling a finFET device to be formed having an anticipated performance, for example, an expected threshold voltage. Hence, rather than device fabrication being dependent upon the vagaries associated with removal of a material layer (e.g., a HARP layer subsequently forming an element isolator) a level of repeatability is associated with the finFET device fabrication process that cannot be achieved by a process conducted based on the approach of material layer removal.

DETAILED DESCRIPTION

The subject innovation presents various techniques relating to forming a fin FET comprising a pMOS structure which can be utilized, in conjunction with a nMOS finFET structure, to form a CMOS device. While boron in conjunction with a Si:C layer is utilized, as described in the Background, to facilitate formation of a punch-through stopper layer in a nMOS structure, a pMOS device is doped with elements other than boron, for example a pMOS device may be formed with a group V element such as arsenic (As) as a dopant element. In a pMOS device, arsenic can migrate into the channel region (e.g., channel 1590 of FIG. 16) thereby deleteriously affecting electron/hole mobility in the channel resulting in an undesired shift in the threshold voltage Vth of the channel. Hence, an approach for formation of an effective punch-through stopper is required, as described further below with reference to FIGS. 1-7.

Further, as described supra, accurate determination of respective layers comprising a fin(s) is required to facilitate an acceptable degree of structural and process repeatability among fin(s) and semiconductor devices. An approach for accurate determination of respective layers is described further below with reference to FIGS. 8-14.

It is to be appreciated that while the various exemplary, non-limiting embodiments presented herein generally relate to formation of a pMOS device comprising arsenic with a punch-through stopper layer comprising Si:C in conjunction with boron, the various exemplary, non-limiting embodiments are not so limited and the concept of utilizing a punch-through stopper layer being utilized to prevent migration of a first element (e.g., arsenic) and a second element (e.g., boron) can equally be applied to the formation of other structures comprising the desired relationship between a first element and a second element. For example, while the following embodiments are presented with regard to elements such as arsenic, boron, phosphorus, the embodiments are equally applicable to any dopant/impurity applicable to operation of nMOS and pMOS finFET devices.

Process for Forming a CMOS Device Comprising a Punch-Through Stopper Layer

FIGS. 1-6 illustrate a series of exemplary, non-limiting embodiments to facilitate formation of a balanced CMOS semiconducting device comprising a nMOS finFET and a pMOS finFET. Typically the substrate (e.g., a Si-region) in a nMOS device comprises Si typically doped with a group III element such as boron (B) (or any of aluminum (Al), indium (In), gallium (Ga), etc.) while the Si-region in a pMOS device comprises Si doped with a group V element such as arsenic (As) (or any of phosphorous (P), antimony (Sb), etc.).

Figure 1:
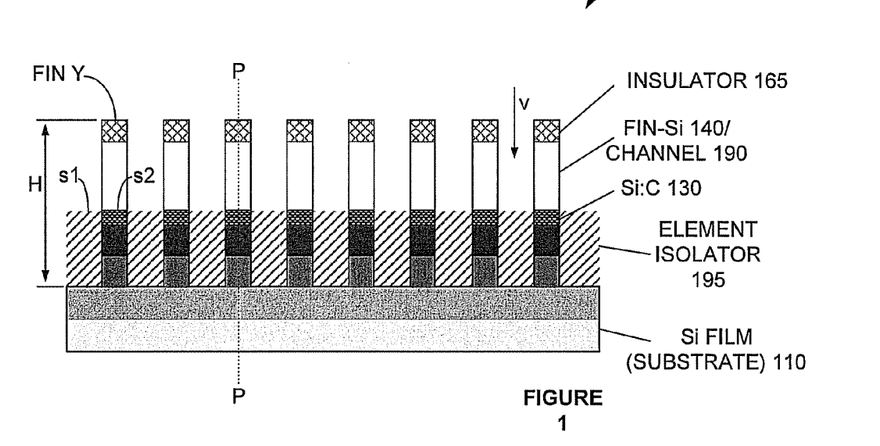
FIG. 1 is a block diagram illustrating a non-limiting, exemplary embodiment of a structure comprising a nMOS finFET.

FIG. 1 (structure 100) depicts (with reference to FIGS. 15 and 16) an approach for effecting a level of electron/hole mobility to the fin-Si region (i.e., channel 1590) where a layer of Si:C is utilized to constrain a dopant (e.g., a group III dopant such as boron) in the nMOS device, where the dopant can be utilized as a punch-through stopper. In an exemplary, non-limiting embodiment, the carbon containing Si:C 130 layer is epitaxially grown on to Si film 110. A Si film 140 (fin-Si) is further epitaxially grown on the Si:C 130 layer, and finally an insulating layer 165 formed thereon, where, for example, the insulating layer can be TEOS. As previously mentioned, the portion of Si film 140 located under the gate (e.g., a gate 1580) operates as a channel 190.

As shown in FIG. 1, Si:C layer 130 can suppress diffusion of, for example, boron. Boron has a feature of being diffused together with the interstitial silicon in the Si:C film 130, however, carbon in the Si:C film 130 suppresses the diffusion of the interstitial Si by trapping the interstitial Si and hence in doing so, suppresses diffusion of the associated boron. Hence, the boron is trapped at the interface between the Si:C film 130 and the fin-Si film 140 (which is constrained to form channel 190) and thus an effective punch-through stopper is formed, which acts to control impurity concentration in channel 190, and as a result, it is possible to prevent deleteriously affecting electron/hole mobility in channel 190. In an exemplary, non-limiting embodiment, the group III dopant (e.g., boron) is injected perpendicularly (direction v) to the upper surface of the element isolator film 195. The boron is not only injected into the element isolator film 195 but is also injected into the Si:C film 130 and Si film 110 by a scattering phenomenon. Thereafter, activation annealing is performed such that the punch-through stopper effect is generated.

Figure 2:
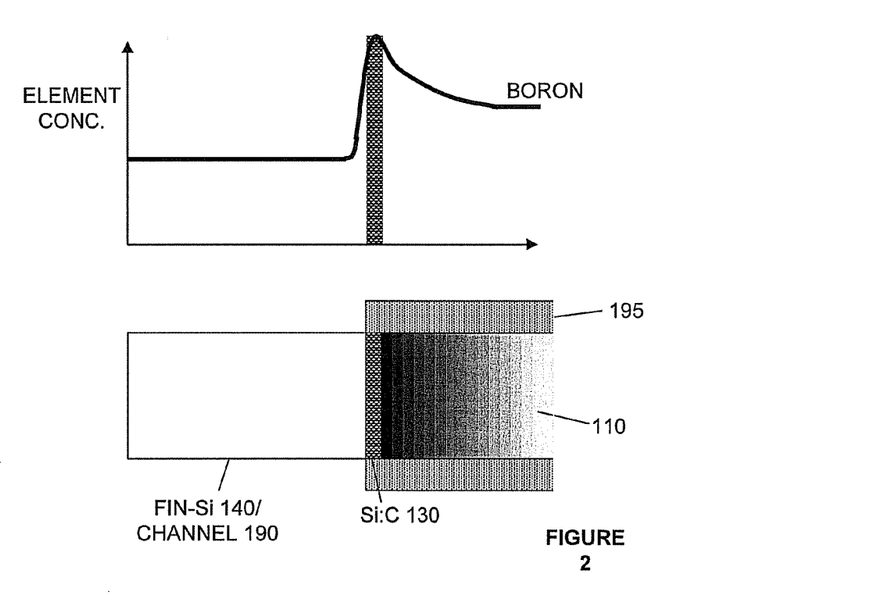
FIG. 2 is a block diagram illustrating a non-limiting, exemplary embodiment of a structure comprising a nMOS finFET.

FIG. 2 illustrates a section through a fin along P-P, and corresponding element (e.g., boron) concentration across respective regions of the fin. As shown in FIG. 2, the level of boron in Si film 110 reaches a maximum at the region of Si:C film 130 with reduced levels of boron in the fin-Si layer 140/channel region 190. Si:C layer 130 acts to suppress diffusion from the boron doped Si film 110 to either of the fin-Si layer 140 or channel region 190. Hence, as shown, while no boron was implanted during the fabrication process into the channel 190, diffusion of an amount of boron has occurred of a required concentration to facilitate adjustment of the Vth of channel 190, while diffusion of the remainder of the boron implanted in Si film 110 is prevented by the Si:C layer 130. It is possible to control the diffusion of the boron from Si region 110 to channel 190 by increasing or reducing the thickness of the Si:C layer 130, the thicker the Si:C layer 130, the greater the degree of diffusion suppression.

Figure 3:
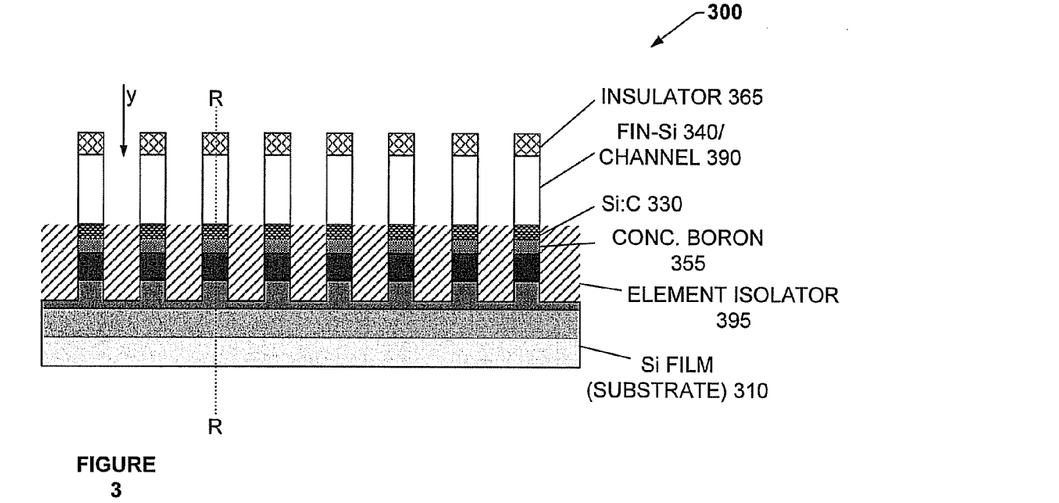
FIG. 3 is a block diagram illustrating a non-limiting, exemplary embodiment of a structure comprising a pMOS finFET.

Turning to FIG. 3 (structure 300), illustrated is a pMOS finFET with Si film 310 doped with a group V element, such as arsenic. To control migration of arsenic from the Si film 310 into channel 390, a punch-through stopper layer Si:C 330 can be utilized to suppress migration of the arsenic from the Si film 310 to channel 390. Further, the addition of a concentration of boron 355 to the region of Si film 310 adjacent to the Si:C layer 330 can be utilized to suppress the generation of a fixed charge, for example, by the Si:C layer 330.

In an exemplary, non-limiting embodiment, the carbon containing Si:C 330 layer is epitaxially grown on to Si film 310. A Si film 340 (fin-Si) is further epitaxially grown on the Si:C 330 layer, and finally an insulating layer 365 formed thereon, where the insulating layer can be TEOS. As previously mentioned, the portion of Si film 340 located under the gate (e.g., a gate 1580) operates as a channel 390. In order to enable the Si:C layer 330 to suppress the diffusion of arsenic and boron from Si region 310 to channel 390, Si:C layer 330 is formed epitaxially on the Si layer 310. In an exemplary, non-limiting embodiment, a carbon concentration is preferably 0.05-3 At % (not less than 0.05 atomic percentage and not more than 3 atomic percentage) for the Si:C layer 330. When the carbon concentration in the Si:C crystal is less than 0.05 At %, a function of suppressing the diffusion may be insufficient, and when exceeding 3 At %, operating characteristics of the transistor may deteriorate. This is because, since the interstitial distance in the Si:C crystal decreases with increasing carbon concentration, a stress is generated in the epitaxial crystal layer due to a difference between a lattice constant of the epitaxial crystal layer as an upper layer and that of the impurity diffusion suppression layer, Si:C layer 330, where the stress may be increased to the level that adversely affects the operating characteristics of the transistor.

In an exemplary, non-limiting embodiment, the group III dopant (e.g., boron) and the group V dopant (e.g., arsenic) are injected perpendicularly (in direction y) to the upper surface of the element isolator film 395. The boron and arsenic are not only injected into the element isolator film 395 but are also injected into the Si:C film 330 and Si film 310 by a scattering phenomenon. Thereafter, activation annealing is performed such that the punch-through stopper effect is generated.

Figure 4:
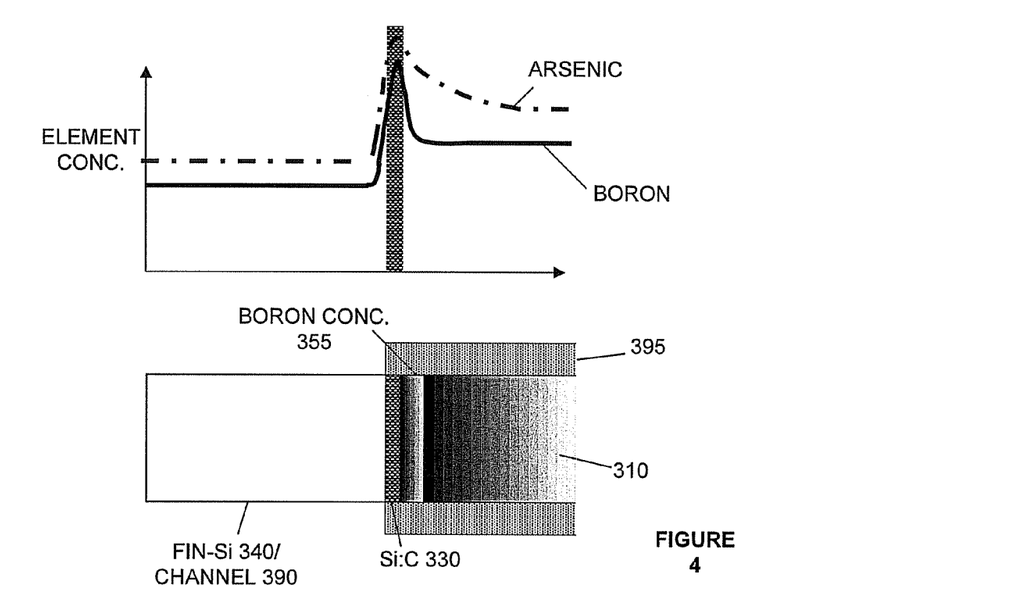
FIG. 4 is a block diagram illustrating a non-limiting, exemplary embodiment of a structure comprising a pMOS finFET.

FIG. 4 illustrates a section through a fin along R-R, and corresponding element (e.g., boron and arsenic) concentration across respective regions of the fin. FIG. 4 illustrates the level of arsenic in Si layer 310 reaching a maximum at Si:C layer 330 as well as an overlaying region 355 of high boron concentration in Si film 310 also reaching a maximum at the Si:C film 330 with reduced respective levels of arsenic and boron in the fin-Si layer 340/channel region 390. As shown in FIG. 4 (and FIG. 3), the boron is concentrated at the interface of the Si film 310 and the Si:C layer 330. Si:C layer 330 acts to suppress diffusion of arsenic and boron from the arsenic and boron doped Si film 310 into either of the fin-Si layer 340 or channel region 390. Hence, as shown, while no arsenic or boron was implanted during the fabrication process into the channel 390, diffusion of a respective amount of arsenic and/or boron has occurred of a required concentration to facilitate adjustment of the Vth of channel 390, while diffusion of the remainder of the arsenic and boron implanted in Si film 310 is prevented by Si:C layer 330. It is possible to control the diffusion of the arsenic and boron from Si region 310 to channel 390 by increasing or reducing the width of the Si:C layer 330, the thicker Si:C layer 330, the greater the degree of diffusion suppression of the respective arsenic or boron.

Hence, as shown with the nMOS device depicted in FIGS. 1 and 2, while the nMOS device comprises a Si:C layer 130 being utilized to prevent diffusion of boron from the Si region 110, with the pMOS device depicted in FIGS. 3 and 4, the Si:C layer 330 is being utilized to prevent diffusion of arsenic dopant in Si region 310 along with a concentration of boron at the interface between the Si region 310 and Si:C 330 to facilitate control of Vth in channel 390. For example, utilizing arsenic as a dopant in the pMOS device can result in an increase in Vth in channel 390, the addition of boron can act to suppress the generation of a fixed charge.

Figure 5:
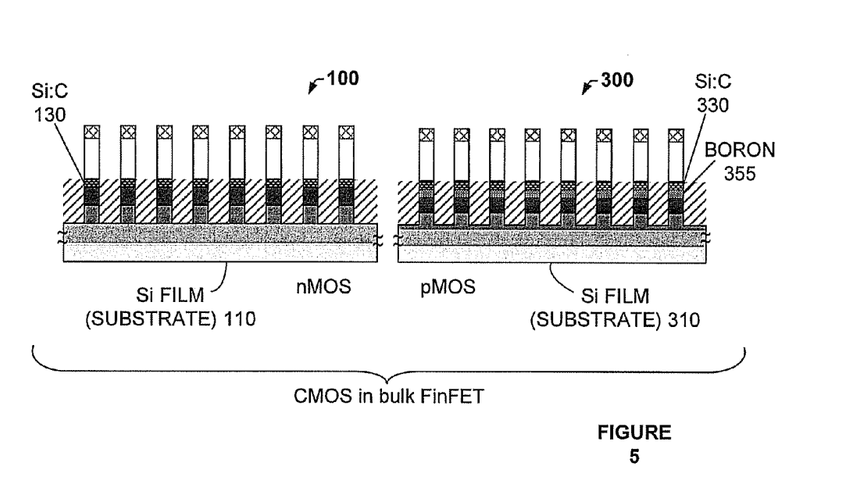
FIG. 5 is a block diagram illustrating a non-limiting, exemplary embodiment of a CMOS structure comprising a nMOS finFET and a pMOS finFET.

FIG. 5 illustrates a combination of an nMOS finFET device (based on structure 100, as illustrated in FIG. 1) with a pMOS finFET device (based on structure 300, as illustrated in FIG. 3) to operate as a balanced CMOS device in a bulk finFET component. As illustrated, both the nMOS and pMOS devices respectively comprise a Si:C layer (respectively layers 130 and 330), where the Si layer 110 of the nMOS finFET is doped with boron, while the Si layer 310 of the pMOS finFET is doped with arsenic with an addition of a concentration of boron, at region 355, at the interface between the Si layer 310 and the Si:C layer 330.

Figure 6:
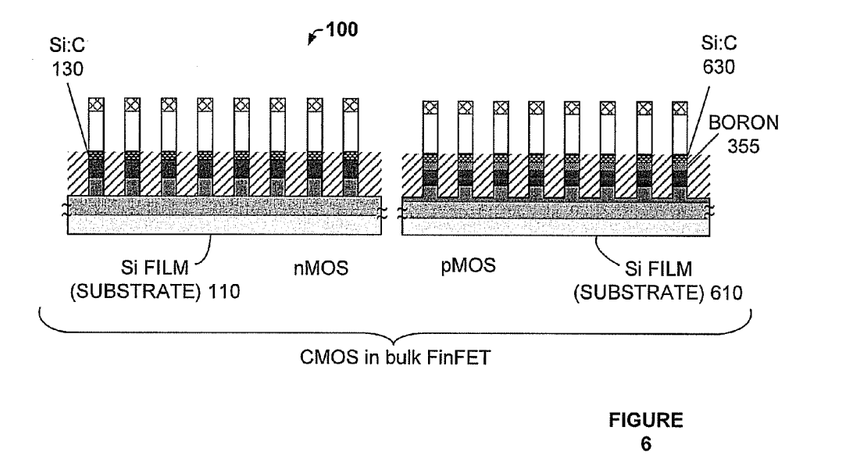
FIG. 6 is a block diagram illustrating a non-limiting, exemplary embodiment of a CMOS structure comprising a nMOS finFET and a pMOS finFET comprising phosphorous impurities.

Turning to FIG. 6, as previously mentioned, a Si:C layer (e.g., either Si:C layer 130 or Si:C layer 330) can be utilized to prevent the diffusion of boron. Boron has a feature of being diffused together with the interstitial silicon in a Si:C layer, however, carbon in the Si:C film acts to suppress the diffusion of the interstitial Si by trapping the interstitial Si and hence in doing so, suppresses diffusion of the associated boron. Hence, the boron is trapped at the interface between the Si:C film (e.g., either Si:C layer 130 or Si:C layer 330) and the fin-Si film (e.g., fin-Si film 140, channel 190, fin-Si film 340 or channel 390) and thus an effective punch-through stopper is formed, which acts to prevent further impurity concentration in a channel (e.g., channel 190, channel 390) and thus prevent electron/hole mobility in the channel. In another exemplary, non-limiting embodiment, where phosphorous is utilized as the dopant in a pMOS finFET device, the Si:C layer 630 acts to prevent diffusion of phosphorous by reacting the phosphorous with carbon in the Si:C layer 630 in a substitutional manner. Hence, as shown in FIG. 6, a balanced CMOS device comprising a bulk finFET can be fabricated with a phosphorous dopant in conjunction with a concentrated region 355 of boron.

Figure 7:
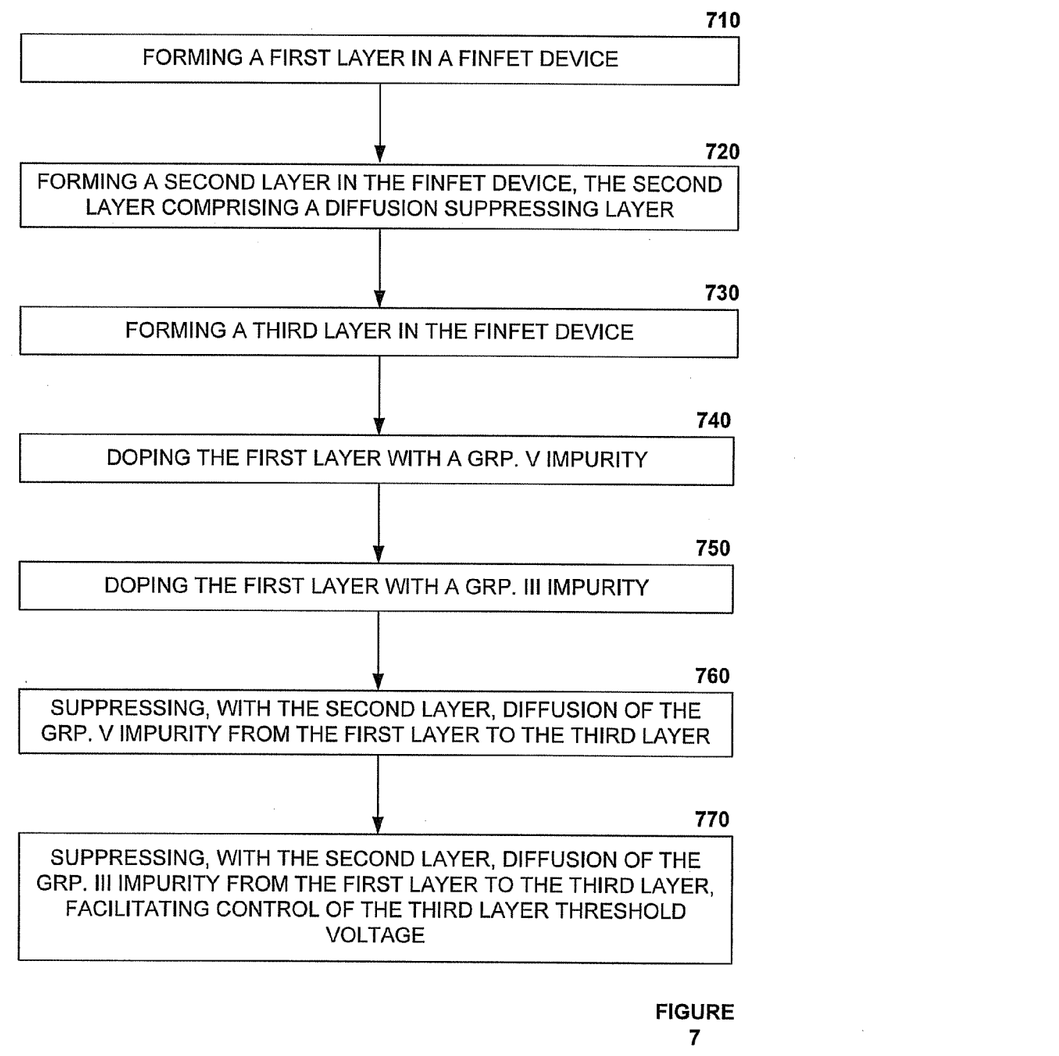
FIG. 7 is a flow diagram illustrating suppressing dopant diffusion according to a non-limiting, exemplary embodiment.

FIG. 7 presents a flow diagram illustrating an exemplary, non-limiting embodiment to facilitate suppressing diffusion of impurities to facilitate control of a threshold voltage of a finFET channel region. As previously described, the various exemplary, non-limiting embodiments presented herein, effectively utilize a Si:C layer to control flow of at least one of a group III impurity or a group V impurity from a doped Si region to the channel region.

At 710 a first layer is formed. The various embodiments presented herein are applicable to any finFET structure where it is desired to control a threshold voltage of a channel region. In an exemplary, non-limiting embodiment, the first layer comprises a silicon substrate (e.g., Si Film 310).

At 720, a second layer is formed, where the second layer is configured to operate as a diffusion suppressing layer. The second layer (e.g., Si:C layer 330) comprises Si:C which acts to suppress diffusion of various impurities/dopants.

At 730, a third layer is formed. The third layer (e.g., Fin-Si 140), based upon configuration of an associated gate structure (e.g., gate 1580 and gate insulating film 1570) comprises a drain region (e.g., drain 1560), a source region (e.g., 1550) and channel (e.g., channel 190) of the finFET device.

At 740, the first layer is doped with a group V element. Depending upon the configuration, the group V element can be any of arsenic, phosphorus, etc. In an exemplary, non-limiting embodiment, the group V element dopant can be added to the first layer based on scattering from an adjacent structure.

At 750, the first layer is doped with a group III element. Depending upon the configuration, the group III element can be any of boron, aluminum, indium, gallium, etc. In an exemplary, non-limiting embodiment, the group III element dopant can be added to the first layer based on scattering from an adjacent structure.

At 760, the second layer suppresses diffusion of the group V dopant from the first layer to the third layer. In an exemplary, non-limiting embodiment, where the group V dopant is arsenic, for example, the threshold voltage of the third layer is increased as the concentration of group V dopant increases, if group V dopant diffuses into fin-Si. The increase in threshold voltage can be an unwanted effect, where a target threshold voltage is expected for the third layer (e.g., when the third layer is operating as a channel in association with a gate in a finFET device).

At 770, the second layer suppresses diffusion of the group III dopant from the first layer to the third layer. Owing to the increase in threshold voltage resulting from the diffusion of the group V dopant into the third layer, the increase of Vth by the generation of fixed charge can be suppressed by addition boron to the third layer. Hence, a concentration of group III dopant can be enabled, thereby restoring the threshold voltage to a target value, and thus enabling the channel to operate with an expected threshold voltage (e.g., when the third layer is operating as a channel in association with a gate in a finFET device).

Structures for Determining Layer Heights in a finFET Device

To facilitate formation of finFET devices having a high degree of device-to-device consistency and repeatability (e.g., structural), control of the respective films/layers comprising a finFET device is also a desired goal in finFET production. For example, it is desirable to know the relative heights, thicknesses, etc. of the films/layers (e.g., Si film 110, Si:C film 130, fin-Si layer 140, channel 190, Si film 310, Si:C film 330, fin-Si layer 340, channel 390, etc.) which can comprise a fin with reference to each other as well as with reference to the height of other layers (such as element isolating layer 195 or 395). As described previously with reference to FIGS. 17-19, the length of a fin (e.g., x1, x2, x3) is a direct function of the position of the element isolating layer (e.g., 1795, 1895, 1995) and hence the length (and corresponding volume) of the fin channel (e.g., 1790, 1890, 1990) is also directly related to the position of the element isolating layer, which can introduce an undesired level of process variability/device inconsistency (e.g., unacceptable range of Vth).

Figure 8:
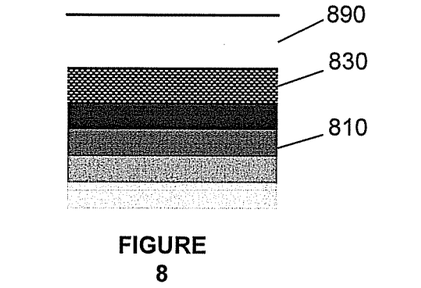
FIG. 8 is a block diagram illustrating a non-limiting, exemplary embodiment of a finFET structure.

As illustrated in FIG. 8, in conjunction with FIGS. 1, 3, and 17-19, it can be problematic to identify the transition from a Si layer 810 (e.g., any of Si layer 110, 310, 1710, 1810, 1910), to a Si:C layer 830 (e.g., any of Si:C layer 130, 330, 1730, 1830, 1930), to further transitioning to a Si layer 890 (e.g., any of channel 190, 390, 1790, 1890, 1990, or fin-Si film 140, 340), particularly relative to a surface of a HARP (e.g., layer 1195 in FIG. 11) in the process of removal.

Figure 9:
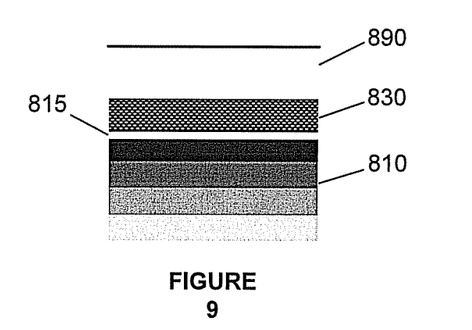
FIG. 9 is a block diagram illustrating a non-limiting, exemplary embodiment of a finFET structure comprising a Si:Ge layer.

Along with an Si:C layer acting to suppress diffusion of group III and/or group V dopants/impurities (as previously described), a layer comprising Si:Ge can similarly prevent diffusion of dopants/impurities such as group III and/or group V elements. Thus, in an exemplary, non-limiting embodiment, as illustrated in FIG. 9, it is possible to form a Si:Ge layer (e.g., Si:Ge layer 815) between Si layer 810 and Si:C layer 830. In an exemplary, non-limiting embodiment, Si:Ge 815 layer can comprise of a concentration of germanium, for example 5%-20%, and have a thickness of about 1-3 nm.

Figure 10:
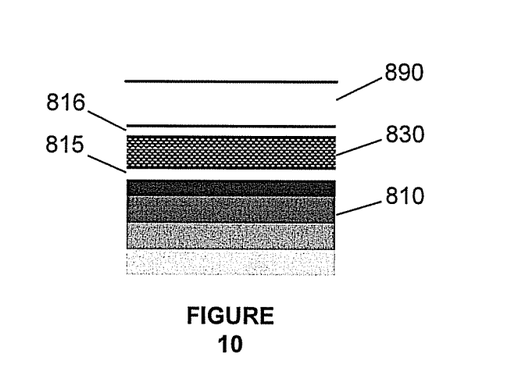
FIG. 10 is a block diagram illustrating a non-limiting, exemplary embodiment of a finFET structure comprising a plurality of Si:Ge layers.

Thus, in a further exemplary, non-limiting embodiment, as illustrated in FIG. 10, it is possible to form a Si:Ge layer (e.g., Si:Ge layer 815) between Si layer 810 and Si:C layer 830. A further Si:Ge layer (e.g., Si:Ge layer 816) between Si:C layer 830 and Si layer 890. In an exemplary, non-limiting embodiment, Si:Ge layer 816 can comprise of a concentration of germanium, for example 5%-20%, and have a thickness of about 1-3 nm.

Figure 11:
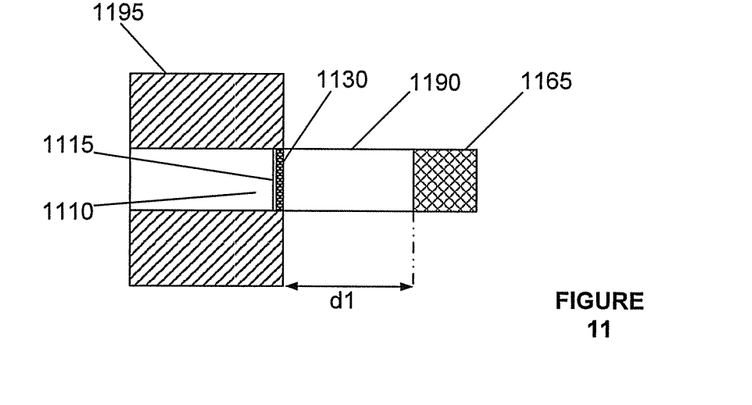
FIG. 11 is a block diagram illustrating a non-limiting, exemplary embodiment of a finFET structure comprising a Si:Ge layer.
Figure 12:
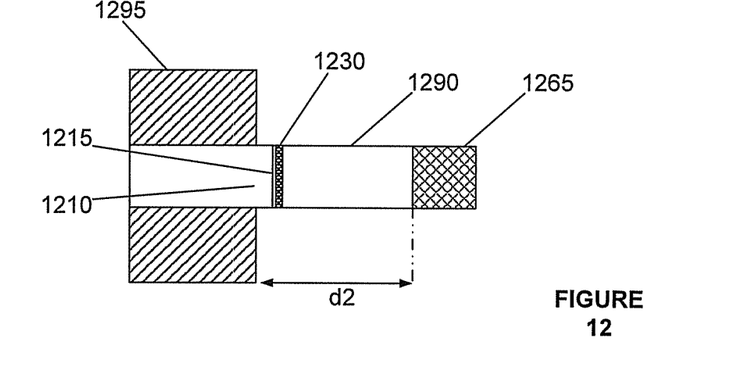
FIG. 12 is a block diagram illustrating a non-limiting, exemplary embodiment of a finFET structure comprising a Si:Ge layer.
Figure 13:
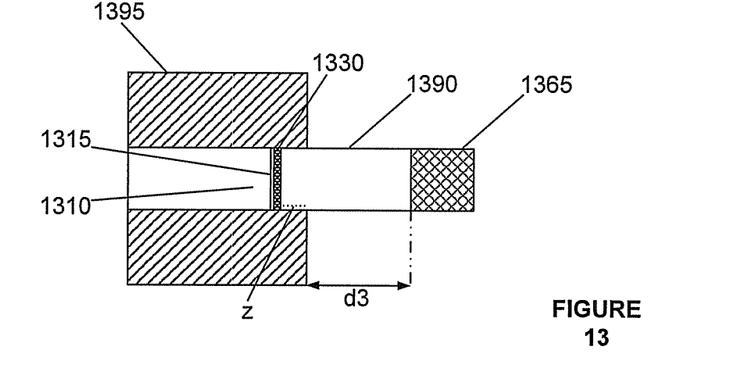
FIG. 13 is a block diagram illustrating a non-limiting, exemplary embodiment of a finFET structure comprising a Si:Ge layer.

In an exemplary, non-limiting embodiment, the position of the Si:Ge layer can be determined by any suitable means, for example, a spectroscopic ellipsometer. Thus, in comparison with the processes depicted in FIGS. 17-19, it is possible to detect the Si:Ge layer and utilize the determined position as part of identifying the amount of an element isolating layer to remove. For example, FIG. 11 illustrates a fin channel 1190 formed on substrate 1110, with an Si:Ge layer 1115, a Si:C layer 1130, and a insulating layer 1165 formed therewith. As shown, element isolating layer 1195 has been removed such that the surface of layer 1195 aligns with the surface of the Si:C layer 1130 thereby exposing a desired region of channel 1190. It is possible that there will be a level of process variability regarding the amount of a fin channel being exposed, however such variability can be accommodated by the exemplary, non-limiting embodiment. For example, as illustrated in FIG. 12, a fin channel 1290 formed on substrate 1210, with an Si:Ge layer 1215, a Si:C layer 1230, and a insulating layer 1265 formed therewith, while the element isolating layer 1295 has been removed to a depth beyond optimal (e.g., d2>d1) the Si:C layer 1230 is constrained by the Si:Ge layer 1215 and hence the fin channel 1290 will operate as expected. In another example, as illustrated in FIG. 13, a fin channel 1390 formed on substrate 1310, with an Si:Ge layer 1315, a Si:C layer 1330, and a insulating layer 1365 formed therewith, while the element isolating layer 1395 has not been removed to an optimal depth beyond optimal (e.g., d1>d3) the fin channel 1390 will operate as expected as long as the distance z is within a distance such that distance d3 is not overly short, which is possible when using the Si:Ge layer (e.g., layer 1315) from which to determine the amount of element isolating layer 1395 to remove.

Figure 14:
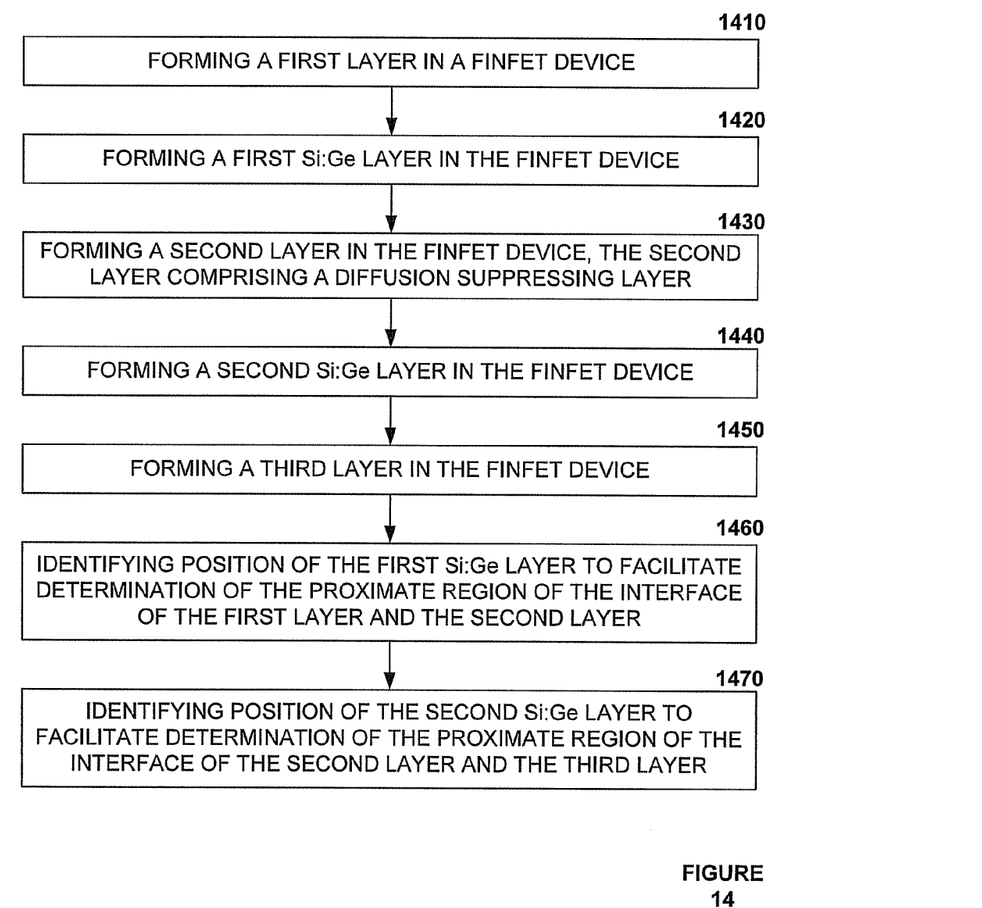
FIG. 14 is a flow diagram illustrating location of layer determination according to a non-limiting, exemplary embodiment.

FIG. 14 presents a flow diagram illustrating an exemplary, non-limiting embodiment to facilitate determination of the location of respective layers forming a fin in a finFET device. As previously described, the various exemplary, non-limiting embodiments presented herein, with conventional approaches it can be difficult to identify the interface region of a Si layer (e.g., Si layer 810) with a Si:C layer (e.g., Si:C layer 830) and also the interface region of the Si:C layer with a second Si layer (e.g., Si layer 890) formed thereon.

At 1410 a first layer is formed. The various embodiments presented herein are applicable to any finFET structure where it is desired to determine location of a particular layer. In an exemplary, non-limiting embodiment, the first layer comprises a silicon substrate (e.g., Si Film 110, 310, or 810).

At 1420, a first Si:Ge containing layer is formed over the first layer. The Si:Ge layer (e.g., Si:Ge layer 815), as previously mentioned, acts as a diffusion suppressor and owing to the composition the location of the Si:Ge layer relative to adjacent layers can be determined, for example, by spectroscopic ellipsometer.

At 1430, a second layer is formed, where the second layer is configured to also operate as a diffusion suppressing layer. The second layer (e.g., Si:C layer 130, 330, or 830) comprises Si:C which acts to suppress diffusion of various impurities/dopants.

At 1440, a second Si:Ge containing layer is formed over the second layer. The second Si:Ge layer (e.g., Si:Ge layer 816), as previously mentioned, acts as a diffusion suppressor and owing to the composition the location of the Si:Ge layer relative to adjacent layers can be determined.

At 1450, a third layer is formed. The third layer (e.g., Fin-Si 140 or 340, channel 190, 390, or 890), based upon configuration of an associated gate structure (e.g., gate 1580 and gate insulating film 1570) comprises a drain region (e.g., drain 1560), a source region (e.g., 1550) and channel (e.g., channel 190, 390, or 890) of the finFET device.

At 1460, the position of the first Si:Ge layer is identified from which it is possible to determine the position of the adjacent first and second layers.

At 1470, the position of the second Si:Ge layer is identified from which it is possible to determine the position of the adjacent second and third layers.

General Considerations

It is to be appreciated that the various layers, etc., comprising any of the finFET structures presented herein are simply presented to facilitate understanding of the various exemplary, non-limiting embodiments, and application of the exemplary, non-limiting embodiments is not limited to application with finFET structures comprising layers presented herein, but rather can be utilized with any finFET structures configuration applicable to the exemplary, non-limiting embodiments.

The various layers presented in the foregoing can be formed/deposited by any suitable process such as a thermal processing, phase conversion, spin coating, deposition, CVD process, for example, low pressure chemical vapor deposition (LPCVD), plasma enhanced chemical vapor deposition (PECVD), molecular-beam epitaxy (MBE), liquid-phase epitaxy (LPE), vapor-phase epitaxy (VPE), solid-phase epitaxy (SPE), deposition doping, etc.

Any suitable technique can be used to pattern any of the material layers presented herein. For example, patterning can be created by employing a photoresist which is patterned using standard photolithographic techniques to form the required pattern to create the pattern, fin, trench, opening, etc., wherein the photoresist is exposed to electromagnetic radiation through a mask having an image pattern of a desired layout (e.g., fins, desired trenches, etc.).

Etching can be by any etching/material removal technique that is applicable to the various embodiments, as described herein. For example, a wet or dry etching technique can be employed for patterning, while in another aspect, etching can be by a specific anisotropically etch. Etching can be utilized to remove a particular layer where a given layer may be susceptible to etch by a particular etchant while a neighboring layer is not. In another example, anisotropic etching techniques can be utilized to control material removal in a specific direction (unlike standard wet etching) such as vertically down into a stack to form a fin, an opening, etc.

Levelling of layers after formation can be by any suitable technique, e.g., by chemical mechanical polish/planarization (CMP) or other suitable process, to achieve a given dimension, in preparation for the next stage in creation of the replacement gate/contact structure, etc.

It is to be appreciated that while a Si:C layer to control dopant diffusion from a first region in a finFET to a second region in a finFETin is described, there may be certain procedures that are not fully disclosed during description of the various embodiments as presented herein. However, rather than provide description of each and every operation involved in the various operations facilitating formation, patterning, removal, etc., of each structure presented herein, for the sake of description only the general operations are described. Hence, while no mention may be presented regarding a particular operation pertaining to aspects of a particular figure, it is to be appreciated that any necessary operation, while either not fully disclosed, or not mentioned, to facilitate formation/deconstruction of a particular layer/element/aspect presented in a particular figure is considered to have been conducted. For example, while no mention may be made regarding a layer described in a preceding figure being leveled (e.g., by chemical mechanical polish, or other suitable operation) it is considered, for the sake of readability of the various exemplary embodiments presented herein, that the leveling process occurred, as have any other necessary operations. It is appreciated that the various operations, e.g., leveling, chemical mechanical polish, patterning, photolithography, deposition, layer formation, etching, etc., are well known procedures and are not necessarily expanded upon throughout this description.

The claimed subject matter has been described with reference to the drawings, wherein like reference numerals are used to refer to like elements throughout. In the description, for purposes of explanation, numerous specific details are set forth in order to provide a thorough understanding of the claimed subject matter. It may be evident, however, that the claimed subject matter may be practiced without these specific details. In other instances, well-known structures and devices may be shown in block diagram form in order to facilitate describing the claimed subject matter.

It is to be appreciated that the various Figures illustrating the various embodiments presented herein are simply rendered to facilitate understanding of the various embodiments. Accordingly, the various embodiments can be applicable to respective elements of any dimension, scaling, area, volume, distance, etc., and while a Figure may illustrate a dimension of one element rendered in association with another element, the respective dimensions, scaling, ratios, etc., are not limited to those as rendered but can be of any applicable magnitude.

What has been described above includes examples of the disclosed innovation. It is, of course, not possible to describe every conceivable combination of components or methodologies for purposes of describing the disclosed innovation, but one of ordinary skill in the art can recognize that many further combinations and permutations of the disclosed innovation are possible. Accordingly, the disclosed innovation is intended to embrace all such alterations, modifications and variations that fall within the spirit and scope of the appended claims. Furthermore, to the extent that the term "contain," "includes," "has," "involve," or variants thereof is used in either the detailed description or the claims, such term can be inclusive in a manner similar to the term "comprising" as "comprising" is interpreted when employed as a transitional word in a claim. The word "exemplary" is used herein to mean serving as an example, instance, or illustration. For the avoidance of doubt, the subject matter disclosed herein is not limited by such examples. In addition, any aspect or design described herein as "exemplary" is not necessarily to be construed as preferred or advantageous over other aspects or designs, nor is it meant to preclude equivalent exemplary structures and techniques known to those of ordinary skill in the art.

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

Further, while certain embodiments have been described above, it is to be appreciated that these embodiments have been presented by way of example only, and are not intended to limit the scope of the claimed subject matter. Indeed, the novel methods and devices described herein may be made without departing from the spirit of the above description. The accompanying claims and their equivalents are intended to cover such forms or modifications as would fall within the scope and spirit of the subject innovation.

In addition, it should be appreciated that while the respective methodologies provided above are shown and described as a series of acts for purposes of simplicity, such methodologies are not limited by the order of acts, as some acts can, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

What is claimed is:

1. A semiconductor device comprising:
   a plurality of fin field effect transistors (finFET) structures, the plurality of finFET structures comprising:
   a first finFET in the plurality of finFET structures comprising a first fin, the first fin further comprising:
      a first silicon (Si) layer comprising group III dopant;
      a first carbon-doped Si layer formed on the first Si layer;
      a second Si layer formed on the first carbon-doped Si layer, wherein the second Si layer comprising group III dopant diffused from the first Si layer, the volume of group III dopant diffused into the second Si layer is a function of dopant diffusion control by the first carbon-doped Si layer; and
   a second finFET in the plurality of finFET structures comprising a second fin, the second fin further comprising:
      a third Si layer comprising a group V dopant and a group III dopant;
      a second carbon-doped Si layer formed on the third Si layer;
      a fourth Si layer formed on the second carbon-doped Si layer, wherein the fourth Si layer comprising group V dopant and group III diffused from the third Si layer, the respective volume of group V dopant and group III dopant diffused into the fourth Si layer is a function of dopant diffusion control by the second carbon-doped Si layer.

2. The semiconductor device of claim 1, wherein the first finFET is an nMOS device and the second finFET is a pMOS device, the nMOS device and the pMOS device combine to form a complementary metal-oxide-semiconductor (CMOS) device.

3. The semiconductor device of claim 1, wherein the first carbon-doped Si layer comprises interstitial carbon.

4. The semiconductor device of claim 1, wherein the second carbon-doped Si layer comprises interstitial carbon.

5. The semiconductor device of claim 1, further comprising a germanium-incorporated silicon (Si:Ge) layer formed between at least one of the first Si layer and the first carbon-doped Si layer, or the third Si layer and the second carbon-doped Si layer.

6. The semiconductor device of claim 5, further comprising a Si:Ge layer formed between at least one of the first carbon-doped Si layer and the second Si layer, or the second carbon-doped Si layer and the fourth Si layer.

7. The semiconductor device of claim 1, wherein the group III dopant is boron, and the group V dopant is arsenic.

8. The semiconductor device of claim 1, wherein the threshold voltage of the fourth Si layer is controlled by a combination of the volume of group V dopant and the volume of group III dopant.

9. The semiconductor device of claim 1, further comprising a gate electrode formed to encapsulate at least one of the second Si layer or the fourth Si layer.

10. A semiconductor device comprising:
    a plurality of fin field effect transistors (finFET) structures, the plurality of finFET structures comprising:
    a first finFET in the plurality of finFET structures comprising a first fin, the first fin further comprising:
       a first silicon (Si) layer comprising boron dopant;
       a first carbon-doped Si layer formed on the first Si layer;
       a second Si layer formed on the first carbon-doped Si layer, wherein the second Si layer comprising boron dopant diffused from the first Si layer, the volume of boron dopant diffused into the second Si layer is a function of dopant diffusion control by the first carbon-doped Si layer; and
    a second finFET in the plurality of finFET structures comprising a second fin, the second fin further comprising:
       a third Si layer comprising phosphorus dopant and boron dopant;
       a second carbon-doped Si layer formed on the third Si layer;
       a fourth Si layer formed on the second carbon-doped Si layer, wherein the fourth Si layer comprising boron dopant and phosphorus diffused from the third Si layer, the respective volume of boron dopant and phosphorus dopant diffused into the fourth Si layer is a function of dopant diffusion control by the second carbon-doped Si layer.

11. The semiconductor device of claim 10, wherein the first finFET is an nMOS device and the second finFET is a pMOS device, the nMOS device and the pMOS device combine to form a complementary metal-oxide-semiconductor (CMOS) device.

12. The semiconductor device of claim 10, wherein the first carbon-doped Si layer comprises interstitial carbon.

13. The semiconductor device of claim 10, wherein the second carbon-doped Si layer comprises substitutional carbon.

14. The semiconductor device of claim 10, further comprising a germanium-incorporated silicon (Si:Ge) layer formed between at least one of the first Si layer and the first carbon-doped Si layer, or the third Si layer and the second carbon-doped Si layer.

15. The semiconductor device of claim 14, further comprising a Si:Ge layer formed between at least one of the first carbon-doped Si layer and the second Si layer, or the second carbon-doped Si layer and the fourth Si layer.

* * * * *